(12) United States Patent
Jones et al.

(10) Patent No.: US 8,823,391 B2
(45) Date of Patent: Sep. 2, 2014

(54) REGENERATIVE FEEDBACK RESONANT CIRCUIT

(75) Inventors: A. Mark Jones, West Richland, WA (US); James F. Kelly, Pasco, WA (US); John S. McCloy, Richland, WA (US); Douglas L. McMakin, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 306 days.

(21) Appl. No.: 13/396,402

(22) Filed: Feb. 14, 2012

(65) Prior Publication Data

US 2013/0207670 A1    Aug. 15, 2013

(51) Int. Cl.
*G01R 27/04*    (2006.01)
(52) U.S. Cl.
USPC ........................................................ 324/646
(58) Field of Classification Search
CPC ........................................................ G01R 27/04
See application file for complete search history.

(56) References Cited

U.S. PATENT DOCUMENTS

| | | | |
|---|---|---|---|
| 1,113,149 A | 10/1914 | Armstrong | |
| 2,751,518 A * | 6/1956 | Pierce | 315/3.5 |
| 4,724,389 A * | 2/1988 | Hyde et al. | 324/318 |
| 5,652,556 A * | 7/1997 | Flory et al. | 333/219.1 |
| 7,220,968 B2 | 5/2007 | Burger et al. | |
| 2011/0057653 A1* | 3/2011 | Barmatz et al. | 324/316 |

OTHER PUBLICATIONS

Gangwar et al., Measurement of Dielectric Constant of Zn1-x Mgx TiO3 (ZMT) Ceramic Material at Microwave Frequencies, Recent Advances in Microwave theory and Applications, Internal Conference on Proceedings of International Conference on Microwave, Nov. 21-24, 2008, pp. 607-610.*
Bray, M. G., et al., Chemoselective Salisbury Screen Absorbers for Passive Standoff Detection of Analytes, Antennas and Propagation Soc. Intl. Symp., AP-S, 1-4, 2008.
Bray, M. G., et al., Reconfigurable Dipole Chaff Elements for Passive Standoff Detection of Chemical Agents, Antennas and Propagation Soc. Intl. Symp., 1513-1516, 2007.
Cetinoneri, B., et al., A Microwave-Based Gamma-Ray Detector, Microwave Symp. Digest (MTT), 2010 IEEE MTT-S International, pp. 469-472, 2010.
Baker-Jarvis, J., et al., Dielectric and Conductor-Loss Characterization and Measurements on Electronic Packaging Materials, NIST Technical Note 1520, Jul. 2001.
Taber, R. C., et al., Microwave Oscillators Incorporating Cryogenic Sapphire Dielectric Resonators, IEEE Transactions on Ultrasonics, Ferroelectrics, and Frequency Control, vol. 42, No. 1, Jan. 1995, pp. 111-119.
Ishihara, O., et al., A Highly Stabilized GaAs FET Oscillator Using a Dielectric Resonator Feedback Circuit in 9-14 GHz, IEEE Transactions on Microwave Theory and Techniques, vol. MTT-28, No. 8, Aug. 1980, pp. 817-824.

(Continued)

*Primary Examiner* — Melissa Koval
*Assistant Examiner* — Courtney McDonnough
(74) *Attorney, Agent, or Firm* — A. J. Gokcek (57) ABSTRACT

A regenerative feedback resonant circuit for measuring a transient response in a loop is disclosed. The circuit includes an amplifier for generating a signal in the loop. The circuit further includes a resonator having a resonant cavity and a material located within the cavity. The signal sent into the resonator produces a resonant frequency. A variation of the resonant frequency due to perturbations in electromagnetic properties of the material is measured.

24 Claims, 5 Drawing Sheets

(56) References Cited

OTHER PUBLICATIONS

Young, J. L., et al., Radio freqauency characterization of a split-ringed electrically small electro-optical bulk modulator, Review of Scientific Instruments, vol. 74, No. 10, 2003, pp. 4529-4535.

Krupka, J., et al., Complex Permeability of Demagnetized Microwave Ferrites Near and Above Gyromagnetic Resonance, IEEE Transactions on Magnetics, vol. 12, No. 3, May 1996, pp. 1942-1933.

Easton, C. D., et al., Non-destructive complex permittivity measurement of low permittivity thin film materials, Meas. Sci. Technol., vol. 18, 2007, pp. 2869-2877.

Chen, L. F., et al., Microwave Electronics: Measurement and Materials Characterization, John Wiley & Sons, 2004.

Krupka, J., et al., Comparison of split post dielectric resonator and ferrite disc resonator techniques for microwave permittivity measurements of polycrystalline yttrium iron garnet, Meas. Sci. Technol., vol. 10, 1999, pp. 1004-1008.

Krupka, J., et al., Contactless Measurements of Reisitivity of Semiconductor Wafers Employing Single-Post and Split-Post Dielectric-Resonanator Techniques, IEEE Transactions on Instrumentation and Measurement, vol. 56, No. 5, Oct. 2007, pp. 1839-1844.

Tepper, G., et al., A contactless, microwave-based radiation detector, Nuclear Instruments and Methods in Physics Research A, 458, 2001, pp. 472-477.

Brown. A. R., et al., A K a-Band Micromachined Low-Phase-Noise Oscillator, IEEE Transactions on Microwave Theory and Techniqaues, vol. 47, No. 8, Aug. 1999, pp. 1504-1508.

Krupka, J., Frequency domain complex permittivity measurements at microwave frequencies, Meas. Sci. Technol., 17, 2006, pp. R55-R70.

\* cited by examiner

REGENERATIVE FEEDBACK RESONANT CIRCUIT

STATEMENT REGARDING FEDERALLY SPONSORED RESEARCH OR DEVELOPMENT

The invention was made with Government support under Contract DE-AC-05-76RL01830, awarded by the U.S. Department of Energy. The Government has certain rights in the invention.

TECHNICAL FIELD

This invention relates to regenerative circuits. More specifically, this invention relates to a regenerative feedback resonant circuit for measuring a transient response in a loop.

BACKGROUND OF THE INVENTION

Resonant circuits have long been used to amplify small signals. A regenerative circuit employs positive feedback between the input and output of an amplifier to significantly increase the signal strength. Positive feedback occurs when the phase of the feedback signal is in phase with the input signal and thus reinforces the signal strength. The addition of a resonator to the feedback loop serves to filter the signal so that only the frequency of the resonator is amplified. This type of circuit is well-known and was patented by Edwin Armstrong in 1914 for use as a high-sensitivity radio receiver. Increases of 1,000 to 100,000 times for the gain and the passive quality factor ($Q_{stat}$) of the circuit are achievable due to the positive feedback. The Q factor is a measure of the frequency selectivity of a resonant circuit and is defined as $f_0/\Delta f$, where $f_0$ is the center frequency and $\Delta f$ is the bandwidth between the $-3$ dB frequencies. Regenerative circuits with dielectric resonators in the feedback loop have been used to construct low phase noise microwave oscillators.

What is needed is a regenerative feedback resonant circuit that measures a transient response due to perturbations in electromagnetic properties of various materials.

SUMMARY OF THE INVENTION

The present invention is directed to a regenerative feedback resonant circuit for measuring a transient response in a loop. In one embodiment of the present invention, the circuit comprises an amplifier for generating a signal in the loop and a resonator having a resonant cavity and a material located within the cavity. The signal sent into the resonator produces a resonant frequency, and a variation of the resonant frequency due to perturbations in electromagnetic properties of the material is measured.

In one embodiment, the circuit further comprises a directional coupler for extracting a portion of an amplified output signal from the resonator and a circulator for routing the portion of the extracted output signal from the directional coupler to a receiver circuit.

In an alternative embodiment, the circuit further comprises an antenna for extracting a portion an output signal from the resonator.

In one embodiment, the circuit further comprises a bandpass filter for rejecting frequencies outside a frequency band of the resonator.

The resonator is, but not limited to, a dielectric ring resonator, a split-post dielectric resonator, and a split-ring resonator.

The electromagnetic properties of the perturbed material include at least one of the following: magnetic permeability, electric permittivity, and electrical conductivity. The perturbations are caused by at least one of the following: an optical source, an electromagnetic source, a radiation source, a thermal source, an acoustic source, vibrations, movements, and a mechanical source. The material is selected from, but not limited to, one of the following: a metal, a semiconductor, an insulator, a magnetic material, a dielectric material, a piezoelectric material, a ferroelectric material, a magnetostrictive material, an electrostrictive material, a superconductor, a ferromagnetic material, a multiferroic material, and a thermoelectric material.

In one embodiment, the resonator has an operating frequency in the microwave portion of the electromagnetic spectrum. The resonator has passive quality factors ($Q_{stat}$) ranging from 10 to 7,000. The resonator with the loaded material has positive feedback enhanced dynamic quality factors ($Q_{dyn}$) on the order of 10,000 to 15,000,000.

In one embodiment, the resonator includes a gap and a bore, wherein electric fields are perpendicular across the gap and magnetic fields are longitudinal to the direction of the bore.

In another embodiment of the present invention, a method of measuring a transient response in a loop is disclosed. The method comprises generating a signal in the loop, inputting the signal into a resonator to produce a standing-wave resonant frequency of the resonator, and measuring a variation of the resonant frequency due to perturbations in electromagnetic properties of a material within a cavity of the resonator.

In another embodiment of the present invention, a sensor is disclosed. The sensor includes an amplifier for generating a signal in the loop, a resonator having a resonant cavity and a material located within the cavity, and a directional coupler or an antenna for extracting a portion of an amplified signal from the resonator. The signal is inputted into the resonator to produce a resonant frequency of the resonator, and a variation of the resonant frequency due to perturbations in electromagnetic properties of the material is measured.

In another embodiment of the present invention, a sensing method is disclosed. The method comprises generating a signal in a loop, inputting the signal into a resonator to produce a resonant frequency of the resonator; measuring a variation of the resonant frequency due to perturbations in electromagnetic properties of a material within a cavity of the resonator; and extracting a portion of an amplified signal from the resonator.

DETAILED DESCRIPTION OF THE PREFERRED EMBODIMENTS

The present invention includes several embodiments for a regenerative feedback resonant circuit that detects transient changes in electromagnetic properties of materials. For example, the resonant circuit can be implemented as part of a sensor system which can be remotely monitored for standoff detection. For standoff detection, exfiltration of transducer information (as FM format) can be transmitted effectively with this invention. With an antenna, range would be ideal depending on the output power of a power RF amplifier stage or the degree of splitting on a directional coupler.

In some embodiments, the resonant circuit includes one or more components that are sensitive to a desired perturbation. In one particular embodiment, the circuit includes a cavity resonator and a bandpass filter placed in the positive feedback path of a microwave amplifier. An electromagnetic material placed inside the cavity resonator acts as the transducer and interacts with the desired environment. Depending upon the material type and cavity configuration, the output of the circuit is sensitive, but not limited, to human proximity, acoustic vibrations, electromagnetic fields, light, or temperature.

The cavity of the resonator can be coated with gold or low skin resistance coatings. The gold coatings can help maintain performance of the resonator under adverse environmental air conditions that might normally corrode most commercial resonators.

A benefit of the present invention is that it provides extremely sensitive responses due to the high dynamic quality factor of the system. Dynamic Q-factor values as high as 10-15 million have been measured, which equates to a linewidth of 1 kHz at 8 GHz. In certain embodiments, the Q of the cavity allows the material in the gap to be ac-biased, and that bias can have an RMS value of volts or higher. For example, a rectenna can rectify a large stored voltage (but low current) in the gap, which can be of value to beam in harvestable RF energy to recharge batteries or super-capacitors that would be needed to power the RF amplifier(s). Also, the resonant circuit of the present invention can wirelessly transmit a perturbed or unperturbed time-dependent resonant signal.

Figure 1:
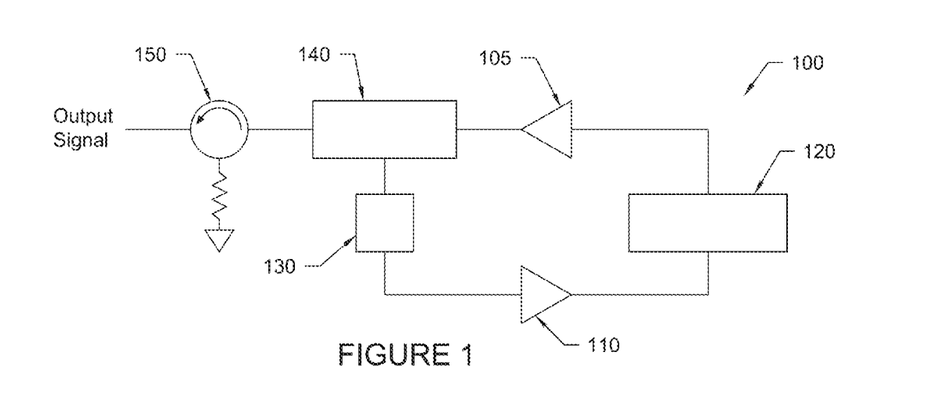
FIG. 1 shows a block diagram of a regenerative feedback resonant circuit, in accordance with one embodiment of the present invention.

FIG. 1 shows a block diagram of a regenerative feedback resonant circuit 100 for measuring a transient response in a loop, in accordance with one embodiment of the present invention. The circuit 100 includes one or more amplifiers 105 and 110 for generating a signal in the loop and increasing signal strength. The circuit 100 also includes a resonator 120 located in a feedback loop of the amplifiers 105 and 110. The resonator 120 comprises a resonant cavity and a material located within the cavity. The signal sent into the resonator 120 produces a resonant frequency, and a variation of the resonant frequency due to perturbations in electromagnetic properties of the material is measured.

In one embodiment, the circuit 100 also includes a bandpass filter 130 to avoid spurious resonances outside the primary frequency band of the resonator. The bandpass filter 130 is not necessary when using a single frequency resonator. The circuit 100 can further include a directional coupler 140 for extracting a portion of the amplified output signal from the resonator 120. Alternatively, the circuit 100 can include an antenna (not shown) for extracting a portion of amplified output signal from the resonator 120. The directional coupler 140 passes the resulting signal through a microwave circulator 150 for direct monitoring of any transient behavior or conversion to a lower frequency. Direct evaluation of the output signal transient behavior can be performed by using, but not limited to, a real-time spectrum analyzer.

The use of positive feedback serves to greatly increase the sensitivity and frequency selectivity of the circuit 100. Measured dynamic Q-factors as large as 10-15 million have been measured for various material loadings. The circuit can be designed to accommodate resonators which use a variety of electromagnetic materials and operate at a frequency within the microwave portion of the electromagnetic spectrum.

The resonator 120 can be, but is not limited to, a dielectric ring resonator, a split-post dielectric resonator, and a split-ring resonator. In one embodiment, the resonator 120 includes a gap and bore, wherein electric fields are perpendicular across the gap and magnetic fields are longitudinal to the direction of the bore. The resonator can be two-dimensional or planar.

The resonator 120 has an operating frequency in the microwave portion of the electromagnetic spectrum and passive quality factors ($Q_{stat}$) ranging from 10 to 7,000. The resonator 120 with the loaded material has positive feedback enhanced dynamic quality factors ($Q_{dyn}$) on the order of 10,000 to 15,000,000.

In one embodiment, a three element sensor can be designed using certain resonators of sparse resonance structure. The three element sensor comprises a resonator having two ports, an amplifier and a directional coupler for output that can act as a high fidelity radio plus transducer.

The electromagnetic properties of the perturbed materials include at least one of the following: magnetic permeability, electric permittivity, and electrical conductivity.

The perturbations can be caused by an optical source, an electromagnetic source, a radiation source, a thermal source, an acoustic source, vibrations, movements, and a mechanical source.

The material in the resonator 120 can be, but is not limited to, a metal, a semi-metal, a semiconductor, an insulator, a magnetic material, a dielectric material, a piezoelectric material, a ferroelectric material, a magnetostrictive material, an electrostrictive material, a superconductor, a ferromagnetic material, a multiferroic material, or a thermoelectric material.

Figure 2:
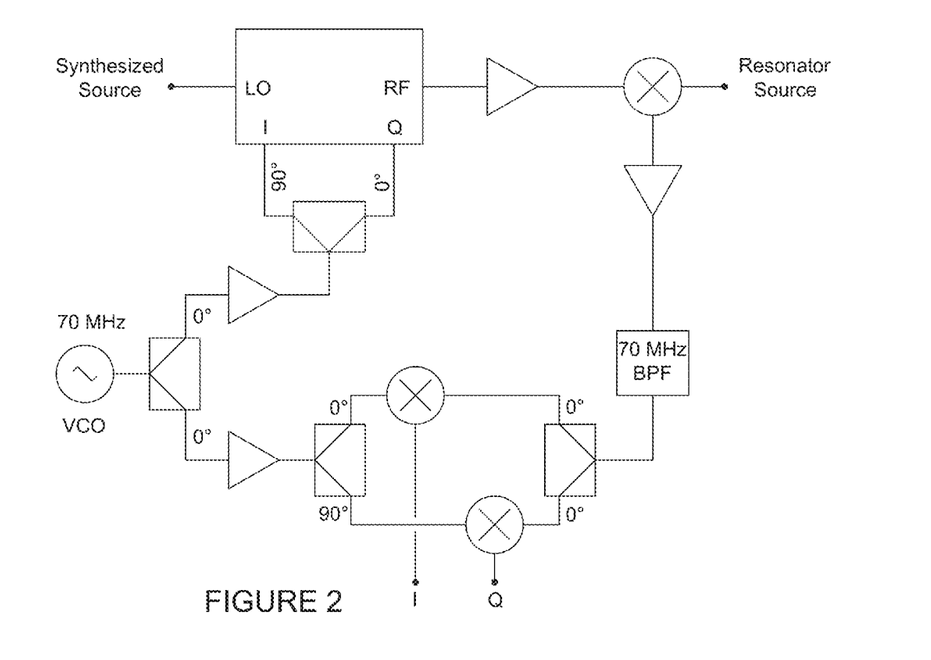
FIG. 2 shows an example receiver used to convert an output signal of the regenerative feedback resonant circuit of FIG. 1 to a lower frequency, in accordance with one embodiment of the present invention.

Direct evaluation of the output signal transient behavior can be performed using, for example, an optional real-time spectrum analyzer (RTSA) as shown in the block diagram of FIG. 2. Alternatively, the signal can be down-converted to a much lower frequency such as 1 MHz to allow the use of a lower-bandwidth monitoring instrument such as a deep-memory digital oscilloscope. A frequency synthesizer can be used as the tunable local oscillator (LO) source in order to select a desired output frequency. However, this receiver circuit is not needed if, for example, direct monitoring of the resonator circuit output signal is accomplished with a RTSA.

The circuit in FIG. 2 contains a quadrature-IF double-balanced mixer which uses signals from a microwave synthesizer source and a voltage-controlled oscillator (VCO) to generate a signal near the frequency of the resonant circuit. The frequency offset between the synthesizer source and the resonant circuit sets the frequency of the IQ baseband signals. The quadrature-IF mixer output signal is amplified and sent into the LO port of a mixer connected to the resonant circuit, and the resulting 70-MHz IF output is amplified, filtered, and sent into the RF port of an IQ demodulator. The 70-MHz VCO signal is also sent into the LO port of the demodulator.

The I and Q baseband signals can be monitored with a digital oscilloscope using voltage-time waveforms. Lissajous figures can also be displayed in XY mode to track the phase differences between the two signals. The oscilloscope can be set to trigger when the waveform deviates from the nominal frequency and digitally record the waveform as it is triggered.

The circuit 100 of the present invention can be used in a broad variety of applications. As one example, the exfiltration of information from unattended remote sensors is a key enabler for security and intelligence gathering. Remote monitoring of process parameters in harsh environments such as industrial plants and nuclear reactors is desirable for performance assessment. The circuit 100 can be optimized to detect the presence and/or unique gait-base signatures of a human body. Certain configurations can be employed to detect the operation of electrical machinery from outside a facility. In the case of acoustic transduction, audio signals modulated on the resonator frequency can be transmitted to a remote location for demodulation and analysis. Each of these operating modes is described below in the experimental section.

Experimental Section

The following examples serve to illustrate certain exemplary embodiments and aspects of the present invention and are not to be construed as limiting the scope thereof.

Experimental Set-Up and Implementation

The regenerative feedback resonant circuit was implemented using discrete components with coaxial microwave connectors to maximize design flexibility and reduce the cost of the proof-of-concept. The two functional blocks shown in FIG. 1 and FIG. 2 were constructed on two separate aluminum plates. The fixed components of the regenerative feedback circuit, as shown in the block diagram of FIG. 1, for 8 GHz resonators, are two 0.1-10 GHz wideband power amplifiers, a 6-18 GHz low noise amplifier, a 7.85-8.95 GHz bandpass filter, a 7-12.4 GHz directional coupler, and a 6-12 GHz circulator.

Custom microwave resonators were purchased for use in material electromagnetic property characterization studies. These resonators included a 7.85 GHz dielectric ring resonator (DRR) and a 8.2 GHz split-post dielectric resonator (SPDR), and were used in the feedback loop of the regenerative circuit. The operating principles of these cavity resonators are well understood. In addition to the transient measurements, the resonators may be used with a vector network analyzer (VNA) to accurately characterize the material properties (e.g., complex permittivity and complex permeability) from the S-parameters before and after perturbation to determine if permanent changes have occurred.

Figure 3:
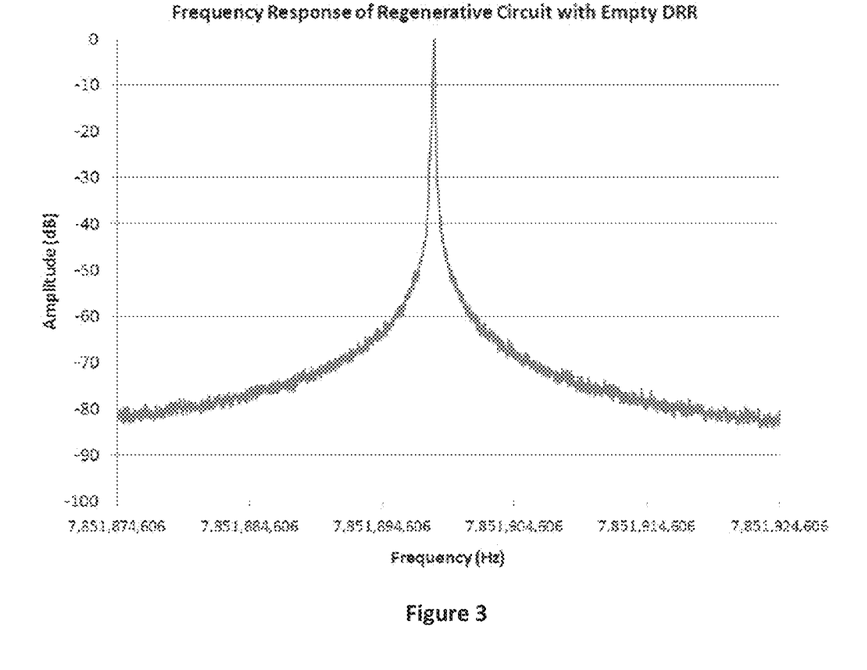
FIG. 3 shows the measured frequency response of the regenerative feedback resonant circuit of FIG. 1 with an empty dielectric ring resonator (DRR).

The 7.85 GHz resonator is a $H_{011}$ mode DRR. It can be used with narrow cylindrical samples of magnetic material which have a maximum diameter of 2 mm. The $Q_{stat}$ of the empty DRR was measured using a VNA and found to be 5,340. The quality factor of the regenerative circuit ($Q_{dyn}$) with the empty DRR in the feedback path was measured using a RTSA and found to be 68 million. This represents an increase in the frequency selectivity by a factor of approximately 12,700. The frequency response of the regenerative circuit with the empty DRR is shown in FIG. 3.

Figure 4:
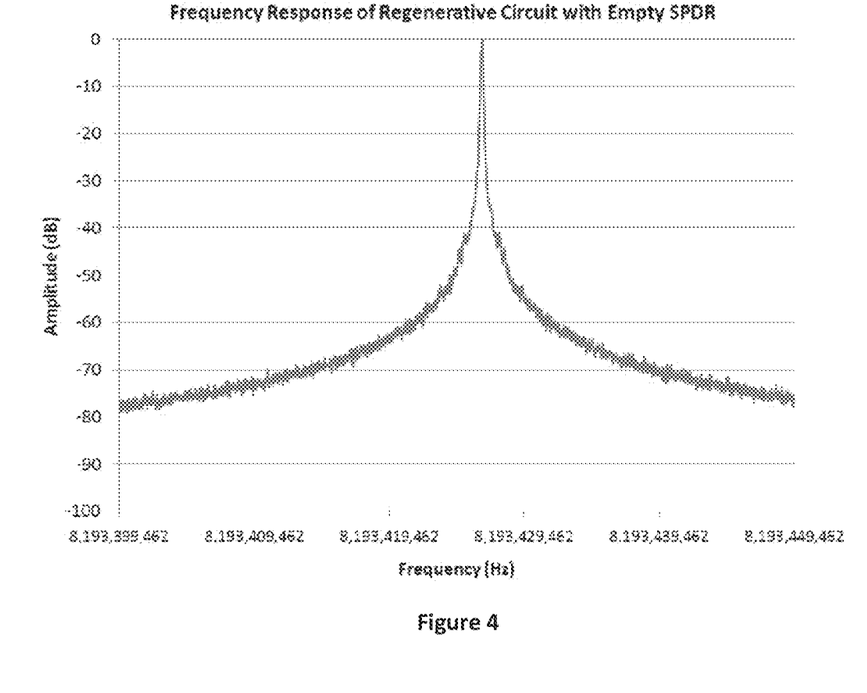
FIG. 4 shows the measured frequency response of the regenerative feedback resonant circuit of FIG. 1 with an empty split-post dielectric resonator (SPDR).

The 8.2 GHz resonator is a $TE_{01\delta}$ mode SPDR. It can be used with uniform sheets of dielectric or magnetic materials, thin ferroelectric films on a dielectric substrate, and high-resistivity semiconductors. The maximum thickness of the sample was 1 mm and minimum size of the sample was 22 mm. The $Q_{stat}$ of the empty SPDR was measured using a VNA and found to be 6,650. The $Q_{dyn}$ of the regenerative circuit with the empty SPDR in the feedback path was measured using a RTSA and found to be 51 million. This represents an increase in frequency selectivity by a factor of approximately 7,700. The frequency response of the regenerative circuit with the empty SPDR is shown in FIG. 4. The trace shown is the average of 10 measurements.

The resonator was mounted on a thermo-electric cooler (TEC) in order to control the thermal environment of the material under test and thus minimize frequency drift due to temperature changes. A cold plate cooler was used with a PID controller. The TEC system includes a finned heat sink attached to the hot side and a cold plate attached to the cold side of the thermo-electric modules. Aluminum interface plates were designed to provide a path of low thermal resistance between the SPDR and the DRR fixtures and the cold plate. A thermistor was mounted to the side of the cold plate with thermal compound to provide temperature feedback to the controller unit, and a small fan was used to convectively cool the heat sink.

It was found that the temperature of the cold plate could be maintained at 19° C. within 0.1° using a commercial TEC system. Tighter control is feasible to a few mK (+/−0.002 C) with custom PIDs tuned to a particular resonator's thermal time constants. Only the proportional and integral coefficients of the PID controller were used. The cooling fan was mounted on a separate fixture to prevent physical vibrations from disturbing the output of the resonant circuit. In addition, the entire resonator and TEC assembly was acoustically isolated from the laboratory bench using closed-cell, high-density foam. A rectangular Plexiglas enclosure was designed to fit onto the resonator platform to protect the material sample from air currents.

Experimental Results

A summary of nine configurations tested with regenerative feedback circuits is shown in Table 1. Note that the resonant frequencies of the circuit with feedback ($F_{dyn}$) may be different than static resonances ($F_{stat}$). An additional phase shift introduced in the resonant loop by components such as amplifiers and transmission lines may cause the phase self-locking behavior of the circuit to resonate at a different frequency. For the cases with material loading, the dynamic Q-factor is between 500 and 3,500 higher than the static Q-factor.

TABLE I

MEASURED FREQUENCY AND Q-FACTOR VALUES FOR STATIC AND DYNAMIC RESONATOR/MATERIAL CONFIGURATIONS.

| Resonator | Material | $F_{stat}$ (GHz) | $F_{dyn}$ (GHz) | $Q_{stat}$ | $Q_{dyn}$ |
|---|---|---|---|---|---|
| SPDR | Empty | 8.196 | 8.193 | 6,650 | 51,000,000 |
| SPDR | Si | 7.992 | 8.034 | 2,600 | 9,000,000 |
| SPDR | Li mica | 7.991 | 8.068 | 5,830 | 4,000,000 |
| DRR | Empty | 7.852 | 7.852 | 5,340 | 68,000,000 |
| DRR | YIG | 7.932 | 8.528 | 4,400 | 15,000,000 |
| SRR | CdTe | 0.287 | 0.287 | 1,000 | 8,700,000 |
| SRR | $LiTaO_3$ | 1.305 | 1.397 | 180 | 450,000 |
| SRR | YIG | 1.090 | 1.540 | 10 | 10,000 |
| SRR | CdSe | 1.267 | 1.707 | 420 | 210,000 |

Figure 5:
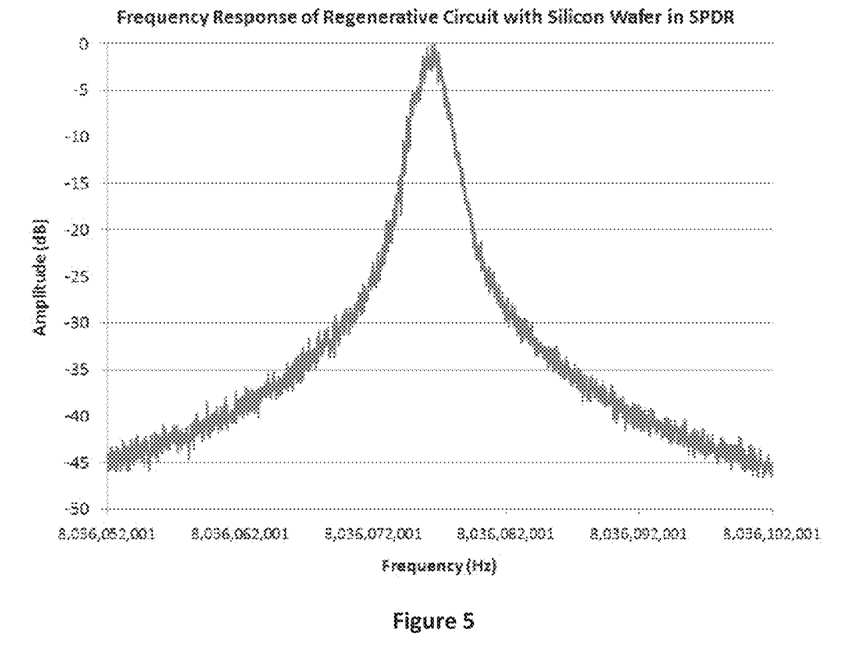
FIG. 5 shows the measured frequency response of the regenerative feedback resonant circuit of FIG. 1 with SPDR in feedback path and a silicon wafer inserted into the SPDR.

The regenerative circuit shown in FIG. 1 was used to demonstrate operation for optical stimulation of charge carriers in a high-resistivity (4,000-5,000 Ω-cm) silicon wafer. The diameter of the wafer was 50 mm and the thickness was 0.28 mm. The SPDR was used with a VNA and material property extraction software to calculate the dielectric permittivity of the wafer to be 11.7 and dielectric loss tangent to be 0.005. The quality factor of the SPDR with the wafer inserted was measured to be 2,600. The quality factor of the regenerative circuit with the wafer inserted into the SPDR was measured to be 9 million. The increase in frequency selectivity for this case was approximately 3,460. The frequency response of the regenerative circuit with the silicon wafer in the SPDR is shown in FIG. 5. The trace shown is the average of 10 consecutive measurements.

The output signal of the circuit shown in FIG. 1 was measured using the DPX digital phosphor spectrum display of a Tektronix 6114A real-time spectrum analyzer. The instrument has 110 MHz of real-time acquisition bandwidth and can display 292,000 spectrum updates per second to capture transient events with a minimum duration of 5.8 microseconds. The advantage of this instrument over a traditional swept spectrum analyzer is the ability to seamlessly capture a signal in real time for frequency spans up to 100 MHz. The persistence of each pixel in the bitmapped spectrum display was set to 5 seconds in order to easily view changes in the signal behavior. The pixels of the DPX display are also color-coded based on the frequency of occurrence.

Figure 6:
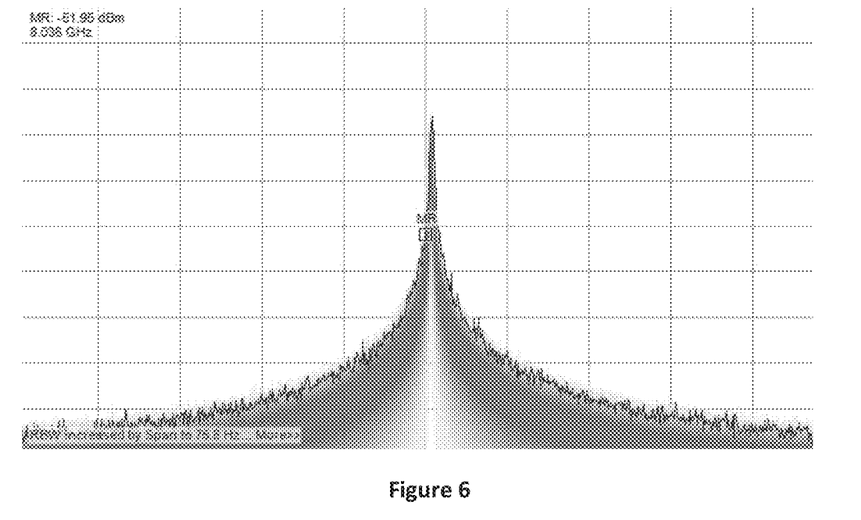
FIG. 6 shows the frequency spectrum plot of the regenerative feedback resonant circuit of FIG. 1 response with silicon wafer inserted into SPDR.

FIG. 6 shows a frame capture of the DPX spectrum display for the baseline condition with the silicon wafer and SPDR in the feedback path. The frequency span was set to 500 kHz and vertical axis was set to 10 dB/division for the plots shown.

Figure 7:
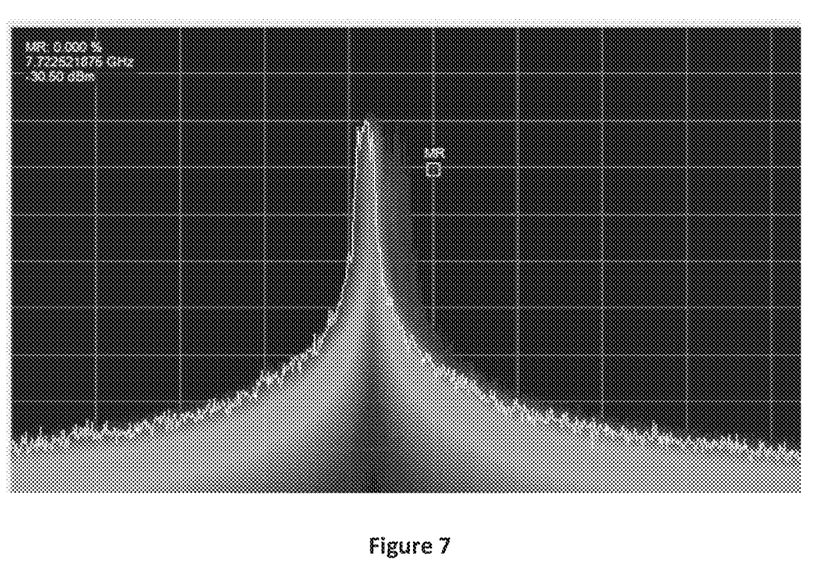
FIG. 7 shows the frequency spectrum plot of the regenerative feedback resonant circuit of FIG. 1 response when the resonator detects human motion.

FIG. 7 shows the frequency spectrum plot of the regenerative feedback resonant circuit of FIG. 1 response when the resonator detects human motion at four meters. As shown by the frequency spectrum plot, the signals appear as time decaying perturbation from the normally stable resonant frequency.

Figure 8:
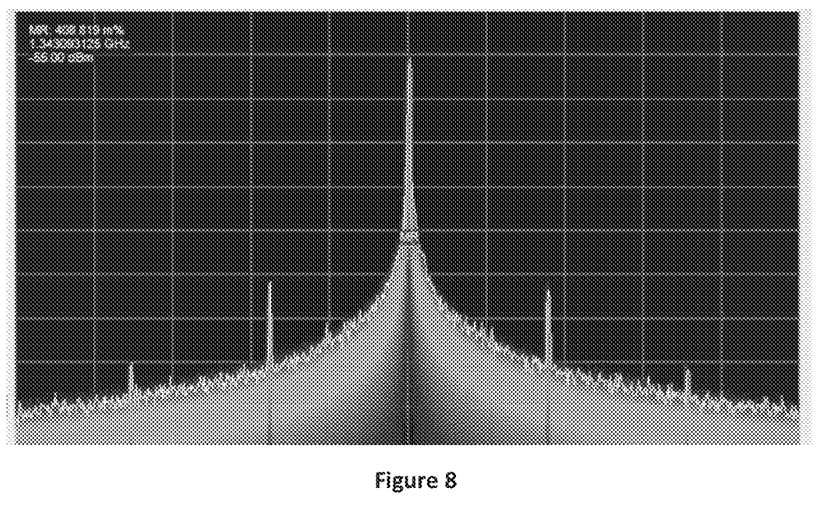
FIG. 8 shows the frequency spectrum plot of the regenerative feedback resonant circuit of FIG. 1 response when the resonator detects electromagnetic fields produced by fluorescent light ballast currents.

FIG. 8 shows the frequency spectrum plot of the regenerative feedback resonant circuit of FIG. 1 response when the resonator detects electromagnetic fields caused by fluorescent light ballasts inside fluorescent light fixtures at four meters. As shown by the frequency spectrum plot, these signals appear as sidebands around the central resonant frequency. The amount of frequency separation from the central resonance depends upon the modulation frequency used in the ballast circuit. Typical ballasts operate at frequencies ranging from 20 kHz to 100 kHz. It was confirmed that these signals are due to ballast operation since they do not occur when the fluorescent bulbs are turned off and do not occur with other types of light sources. Preliminary experiments indicate that certain resonator materials such as periodically poled ferroelectric materials are sensitive to these perturbations. It is anticipated that the circuit configuration of FIG. 1 would enable applications related to detecting signatures of particular equipment with characteristic modulations. Other measured electronic modulation appears as a frequency shift of the main resonance without sidebands.

Figure 9:
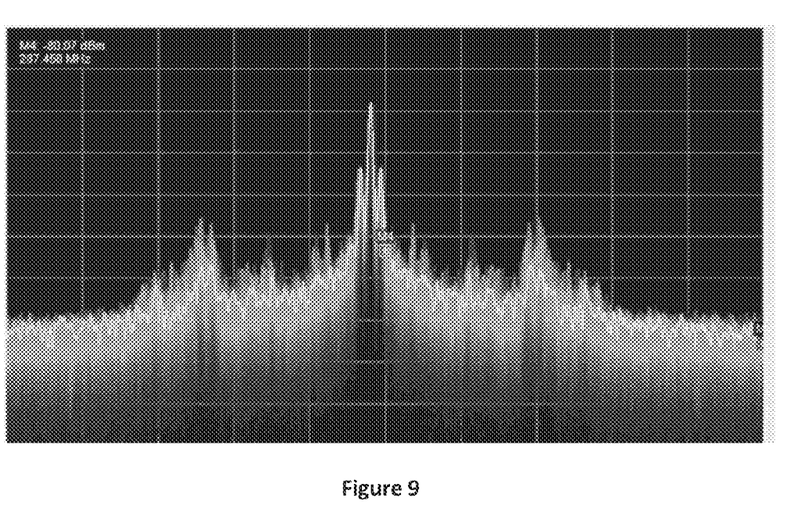
FIG. 9 shows the frequency spectrum plot of the regenerative feedback resonant circuit of FIG. 1 response when the resonator detects human voice.

FIG. 9 shows the frequency spectrum plot of the regenerative feedback resonant circuit of FIG. 1 response when the resonator detects human voice at three meters. As shown by the frequency spectrum plot, the audio is inherently modulated onto the resonator signal and therefore can be transmitted and demodulated. The current understanding of the modality suggests that the transduction mechanism is the resonator feedback probe which is vibrating like a cantilever. Initial electromagnetic simulations have confirmed that the resonant frequency is sensitive to feed loop position. Piezoelectric materials can be used in the resonator to provide further conversion from acoustic to electromagnetic signals.

Figure 10:
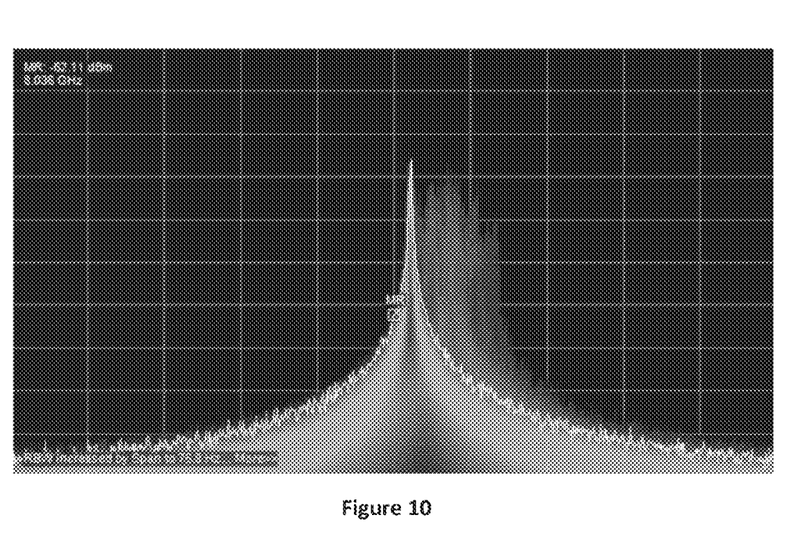
FIG. 10 shows the frequency spectrum plot of the regenerative feedback resonant circuit of FIG. 1 response when the resonator is illuminated with a laser.

FIG. 10 shows the frequency spectrum plot of the regenerative feedback resonant circuit of FIG. 1 response when the resonator is illuminated with a laser. The circuit can detect the presence of light and generate unique responses to different types of optical sources such as flashbulbs and lasers. As shown by the frequency spectrum plot, the light from a laser source creates a time-dependent perturbation in the resonant frequency. The specific frequency shifts and sideband content is characteristic of the type of light and its intensity. Optical sources tested include camera flash bulbs, red and green lasers, and LED lights. Materials useful as transducers for this modality of the sensor include semiconductors with electronic band gaps in the visible to near infrared regime. These devices can also be configured as mixers for RF and optical applications.

Up- or down-conversion of the resonator's instantaneous frequency onto light beams is readily feasible using electro-optic materials in the capacitive gap of resonators. Alternatively, polarization modulation of optical beams is feasible with magneto-optic materials in the loop or well of the resonators where the magnetic field is greatest, or by an electro-optical crystal placed in the strong field of the capacitive gap.

Other possible modalities of the circuit include magnetic sensors, fast response temperature sensors, and radiation sensors. Testing with low Q-factor soft magnets indicated gains of at least 10,000. Results also suggest that the circuit can be used as a fast responding temperature sensor, particularly when constructed with materials having large temperature coefficients in their electromagnetic properties. Sensitivity to ionizing radiation such as gamma rays and neutrons is another use.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made in the embodiments chosen for illustration without departing from the spirit and scope of the invention.

We claim:

1. A regenerative feedback resonant circuit for measuring a transient response in a loop, comprising:
   a. an amplifier for generating a signal in the loop; and
   b. a resonator having a resonant cavity and a material loaded within the cavity, wherein the amplified signal sent into the resonator from the amplifier produces a resonant frequency due to the material loaded cavity, and wherein a variation of the resonant frequency due to perturbations caused by an external source is measured by extracting a portion of the amplified signal to detect the external source.

2. The circuit of claim 1 wherein a directional coupler extracts a portion of the amplified signal from the resonator.

3. The circuit of claim 1 further comprising an antenna for extracting a portion of the amplified signal from the resonator.

4. The circuit of claim 1 further comprising a bandpass filter for rejecting frequencies outside a frequency band of the resonator.

5. The circuit of claim 2 further comprising a circulator for routing the portion of the extracted signal from the directional coupler to a receiver circuit.

6. The circuit of claim 1 wherein the resonator is one of a dielectric ring resonator, a split-post dielectric resonator, and a split-ring resonator.

7. The circuit of claim 1 wherein the perturbations are caused by at least one of the following external sources: an optical source, an electromagnetic source, a radiation source, a thermal source, an acoustic source, vibrations, movements, and a mechanical source.

8. The circuit of claim 1 wherein the material is selected from at least one of the following: a metal, a semiconductor, an insulator, a magnetic material, a dielectric material, a piezoelectric material, a ferroelectric material, a magnetostrictive material, an electrostrictive material, a superconductor, a ferromagnetic material, a multiferroic material, and a thermoelectric material.

9. The circuit of claim 1 wherein the resonator has an operating frequency in the microwave portion of the electromagnetic spectrum.

10. The circuit of claim 9 wherein the resonator has passive quality factors ($Q_{stat}$) ranging from 10 to 7,000.

11. The circuit of claim 9 wherein the resonator with the loaded material has positive feedback enhanced dynamic quality factors ($Q_{dyn}$) on the order of 10,000 to 15,000,000.

12. The circuit of claim 1 wherein the resonator includes a gap and a bore, and wherein electric fields are perpendicular across the gap and magnetic fields are longitudinal to the direction of the bore.

13. A method of measuring a transient response in a loop, comprising:
   a. generating an amplified signal in the loop;
   b. inputting the amplified signal into a resonator having a resonant cavity and a material loaded within the cavity to produce a resonant frequency of the resonator due to the material loaded cavity; and
   c. measuring a variation of the resonant frequency due to perturbations caused by an external source by extracting a portion of the amplified signal to detect the external source.

14. The method of claim 13 further comprising rejecting frequencies outside a frequency band of the resonator.

15. The method of claim 13 further comprising routing the portion of the extracted signal to a receiver circuit.

16. The method of claim 13 wherein the resonator is one of a dielectric ring resonator, a split-post dielectric resonator, and a split-ring resonator.

17. The method of claim 13 wherein the perturbations are caused by at least one of the following external sources: an optical source, an electromagnetic source, a radiation source, a thermal source, an acoustic source, vibrations, movements, and a mechanical source.

18. The method of claim 13 wherein the material is selected from at least one of the following: a metal, a semiconductor, an insulator, a magnetic material, a dielectric material, a piezoelectric material, a ferroelectric material, a magnetostrictive material, an electrostrictive material, a superconductor, a ferromagnetic material, a multiferroic material, and a thermoelectric material.

19. The method of claim 13 wherein the resonator has an operating frequency in the microwave portion of the electromagnetic spectrum.

20. The method of claim 19 wherein the resonator has passive quality factors ($Q_{stat}$) ranging from 10 to 7,000.

21. The method of claim 19 wherein the resonator with the loaded material has positive feedback enhanced dynamic quality factors ($Q_{dyn}$) on the order of 10,000 to 15,000,000.

22. The method of claim 13 wherein the resonator includes a gap and a bore, and wherein electric fields are perpendicular across the gap and magnetic fields are longitudinal to the direction of the bore.

23. A sensor comprising:
   a. an amplifier for generating a signal in a loop;
   b. a resonator having a resonant cavity and a material loaded within the cavity, wherein the amplified signal is inputted into the resonator to produce a resonant frequency of the resonator due to the material loaded cavity, and wherein a variation of the resonant frequency due to perturbations caused by an external source is measured; and
   c. a directional coupler or an antenna for extracting a portion of the amplified signal from the resonator to detect the external source.

24. A sensing method comprising:
   a. generating an amplified signal in a loop;
   b. inputting the amplified signal into a resonator having a resonant cavity and a material loaded within the cavity to produce a resonant frequency of the resonator due to the material loaded cavity;
   c. measuring a variation of the resonant frequency due to perturbations caused by an external source; and
   d. extracting a portion of the amplified signal from the resonator to detect the external source.

* * * * *